United States Patent
Tsuji

Patent Number: 5,990,534
Date of Patent: Nov. 23, 1999

[54] DIODE

[75] Inventor: Kenji Tsuji, Kyoto, Japan

[73] Assignee: Rohm Co., Ltd., Kyoto, Japan

[21] Appl. No.: 08/172,051

[22] Filed: Dec. 23, 1993

[30] Foreign Application Priority Data

Dec. 1, 1993 [JP] Japan .................................. 5-052204

[51] Int. Cl.$^6$ ............................................... H01L 31/058
[52] U.S. Cl. ......................... 257/467; 257/469; 257/470
[58] Field of Search .................................... 257/467, 469, 257/470

[56] References Cited

U.S. PATENT DOCUMENTS 3,286,138  11/1966  Shockley .................................. 257/469

FOREIGN PATENT DOCUMENTS 141596  11/1979  Japan .

OTHER PUBLICATIONS

Webster's II New Riverside University Dictionary p. 453, 1984.
Muller et al, 'Device Electronics for IC' . . . pp. 257 and 270–271; 1986.
Gosch, 'Temp range of Si sensors . . . ', pp. 74–75, Electronics, May 5, 1982.
Muller et al., "Device Electronics for Integrated Circuits"; copyright 1977, 1986; p. 31.

Primary Examiner—Stephen D. Meier
Attorney, Agent, or Firm—Nikaido Marmelstein Murray & Oram LLP

[57] ABSTRACT

A diode suited for absorbing a surge which includes a semiconductor substrate, a pn junction defined in the semiconductor substrate, and an exothermic body adjacent to the pn junction which leads the pn junction to the Zener breakdown under an overcurrent is disclosed. This diode is improved in a characteristic against a surge utilizing the secondary breakdown and prevents the yield from lowering due to inconstancy in resistivity of the wafer used.

6 Claims, 4 Drawing Sheets ature of the pn junction, a high resistivity layer which will not
DIODE

FIELD OF THE INVENTION

The present invention relates to diodes and, more particularly, to a diode suited for absorbing a surge with an improved characteristic against a surge utilizing a secondary breakdown.

BACKGROUND OF THE INVENTION

Hitherto, it has been a conventional practice to use a Zener diode suited for a surge absorber. For example, when a Zener diode is reversely connected to the input side of an electric circuit to be protected, the Zener diode serves as a high resistance against a low voltage of usual signals, and the Zener breakdown occurs in the diode under a high voltage applied to the circuit, which leads the overcurrent flow to the Zener diode to protect the circuit or the semiconductor devices used there from breaking down due to the heavy current.

There are two conventional methods for manufacturing a Zener diode; the first one is to employ a semiconductor substrate having impurity concentration corresponding to the aimed Zener breakdown voltage, and the second one is to grow on a semiconductor substrate an epitaxial semiconductor layer having impurity concentration corresponding to the aimed Zener breakdown voltage.

In manufacturing a Zener diode according to the first method, as shown in FIG. 6, impurities such as boron or indium are diffused into an n-type semiconductor substrate 31 having a thickness of about 130 $\mu$m and a resistivity of about 5 to 600 m$\Omega$·cm corresponding to the aimed Zener breakdown voltage to form a $p^+$-type diffusion region 32 and a pn junction 33. Further, an insulating film 34 made of silicon oxide or the like is formed on the surface of the semiconductor substrate 31 by a CVD process, followed by the formation of a contact hole 35 in a portion of the insulating film 34 for an upper electrode. An $n^+$-type diffusion layer 36 is formed over the entire lower surface of the semiconductor substrate 31 so as to provide an ohmic contact between a lower electrode and the semiconductor substrate 31. Then a metal like aluminum is deposited by, for example, sputtering on the $p^+$-type diffusion region 32 on the upper side of the substrate 31 and on the $n^+$-type diffusion layer 36 on the lower side respectively to form upper and lower electrodes 37 and 38. Finally, the semiconductor substrate 31 is diced into individual chips to complete a Zener diode 39. This method tends to lower the yield because inconstant resistivity of the semiconductor substrate affects Zener characteristics.

On the other hand, in manufacturing a Zener diode according to the second method, as shown in FIG. 5, an $n^+$-type semiconductor substrate 40 is used which has a thickness of 110 $\mu$m and a low resistivity of about $^{1}/_{1000}$ to $^{20}/_{1000}$ $\Omega$·cm. In view of an ohmic contact with the electrodes, the semiconductor substrate 40 is selected to have a low resistivity with impurities of $10^{18}$ atm/cm$^3$ or more. On the surface of the semiconductor substrate 40 n-type semiconductor layer 41 is epitaxially grown upto a 20 $\mu$m-thick which has a resistivity of about 5 to 600 m$\Omega$·cm corresponding to a desired Zener breakdown voltage. In a manner similar to the first method a $p^+$-type diffusion region 32, insulating film 34 and upper electrode 37 are formed. Finally a metal is deposited directly on the lower surface of the semiconductor substrate 40 to form a lower electrode 38, thus completing a Zener diode 42.

When the reverse voltage is applied to the diode manufactured by either of the first or second method to increase the reverse current, the characteristic curve with respect to voltage $V_R$ and current $I_R$ is shown in FIG. 7. A current begins to flow at the Zener breakdown voltage depending on the diode, and a breakdown occurs when the input reaches the breakdown withstand power (allowable loss point C), that is $I_2 \times V_2$, of the diode. Therefore, it is a problem that the diode tends to be broken down under a noise with a large surge current.

SUMMARY OF THE INVENTION

It is, therefore, an object of the present invention to overcome the foregoing problem and provide a diode for absorbing a surge with an improved characteristic to withstand a surge, which allows an increased surge current to flow utilizing the secondary breakdown of the pn junction.

The present invention provides a diode comprising a semiconductor substrate, a pn junction provided to the semiconductor substrate, and an exothermic body being provided in the neighbourhood of the pn junction which produces heat under an overcurrent, whereby a surge current is absorbed by utilizing Zener breakdown of the pn junction.

In this specification, "neighbourhood" means a distance so as to immediately transfer the heat produced in the exothermic body to the pn junction, and so as to cause secondary breakdown of a diode by increasing temperature of the pn junction before the diode breaks caused by exceeding allowable loss.

The present invention also provides a diode, comprising a semiconductor substrate of a first conductivity type and of a low resistivity, a first epitaxial layer of the first conductivity type and of a high resistivity, the first epitaxial layer being formed on the semiconductor substrate, a second epitaxial layer of the first conductivity type which is formed on the first epitaxial layer, a semiconductor region of a second conductivity type which is formed in the second epitaxial layer, and a pn junction defined between the semiconductor region and the second epitaxial layer.

The Zener diode of the present invention breaks down secondary when the temperature of the pn junction reaches about 300° C. and, as shown in FIG. 3 of the characteristic curve with respect to reverse voltage $V_R$ and reverse current $I_R$, the Zener breakdown voltage falls to the vicinity of point $V_1$. For this reason when a noise with a high surge voltage is input, a current begins to flow at a voltage exceeding Zener breakdown voltage $V_Z$, the temperature of the pn junction rises at power A to cause the secondary breakdown, and the breakdown voltage falls to point $A_1$. As a result the current in the diode rises up to point $I_1$ and, hence, the breakdown withstand power of this diode is represented by allowable loss point B ($I_1 \times V_1$) which is equal to aforementioned allowable loss point C ($I_2 \times V_2$). Accordingly, if the Zener breakdown voltage is decreased to $^{1}/_{6}$ because of the secondary breakdown, the allowable current is increased to 6 to 7 times and, hence, the diode withstands a current with a large surge without breaking down. To raise the temperature of the pn junction, a high resistivity layer which will not affect the usual diode characteristics may be provided, for example, within the semiconductor layer, so that resistance loss occurs to raise the temperature under an input of a surge.

DETAILED DESCRIPTION

The present invention will now be described in detail with reference to the drawings.

Figure 1:
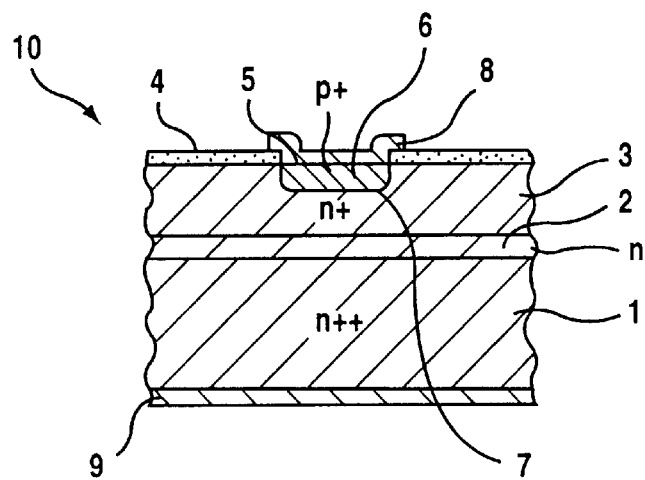
FIG. 1 is an explanatory section showing one embodiment of a diode suited for absorbing a surge according to the present invention.

Referring to FIG. 1, numeral 1 denotes a semiconductor substrate of a first conductivity type ($n^{++}$-type) and of about 80 to 100 $\mu$m thickness. The substrate 1 is composed of, for example, silicon, contains impurities of high concentration of, for example, about $10^{18}/cm^3$ to $10^{19}/cm^3$, with a low resistivity of about $\frac{1}{1000}$ to $\frac{20}{1000}$ $\Omega \cdot cm$. On the substrate 1 is formed a first epitaxial layer 2 of the first conductivity type (n-type) with a resistivity of about 5 to about 20 $\Omega \cdot cm$ and of a thickness of about 10 to 20 $\mu$m. Further, on the first epitaxial layer 2 is formed a second epitaxial layer 3 of $n^+$-type with a resistivity of about 5 to about 600 $m\Omega \cdot cm$ corresponding to the desired Zener breakdown voltage. The second epitaxial layer 3 is covered with an insulating film 4 in which an opening 5 is formed. A semiconductor region 6 of a second conductivity type ($p^+$-type) is formed in the second epitaxial layer 3 under the opening 5 by, for example, ion implantation. An upper electrode 8 and a lower electrode 9 are provided on the opening 5 and on the lower surface of the substrate 1, respectively. A diode suited for absorbing a surge is thus constructed.

Figure 3:
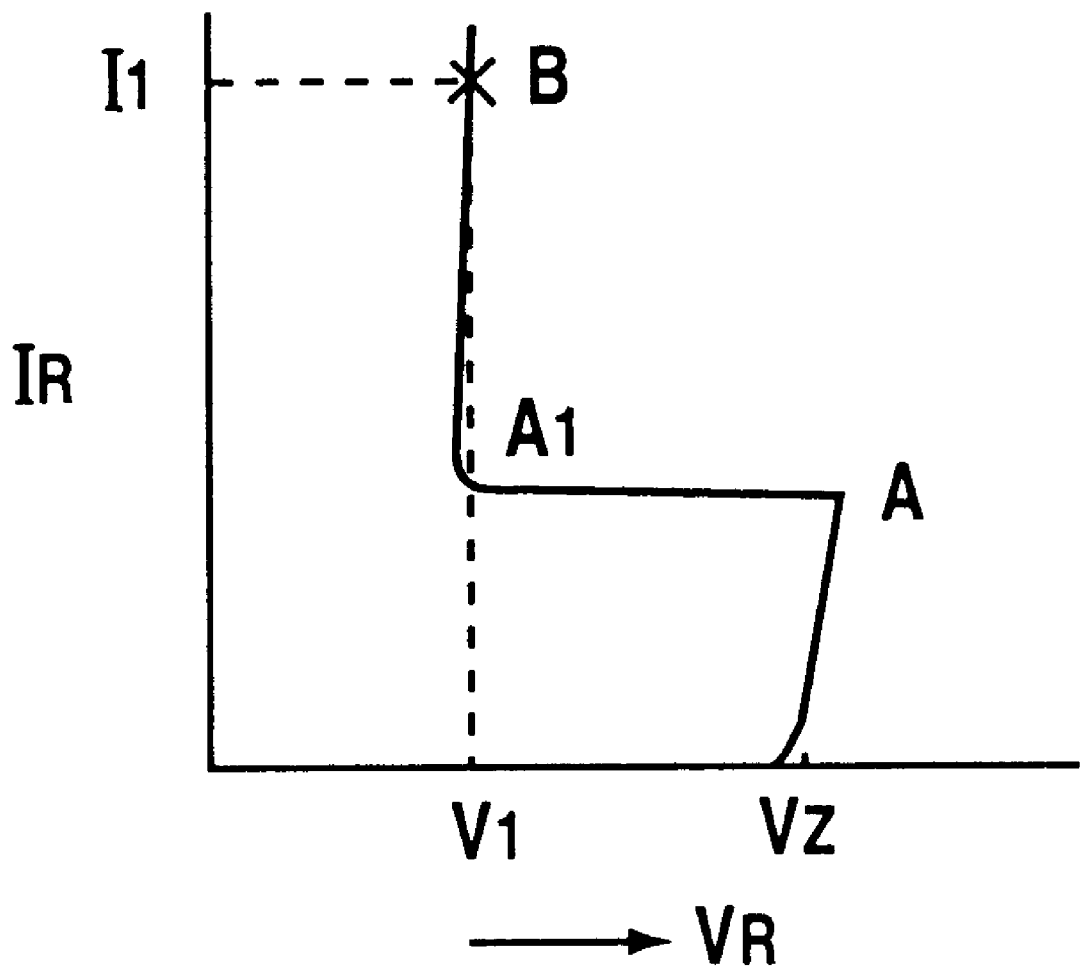
FIG. 3 is a diagrammatic representation of current-voltage characteristics for illustrating the secondary breakdown of a diode according to the present invention.

In the present invention, a pn junction 7 is defined between the second epitaxial layer 3 of the first conductivity type and the semiconductor region 6 of the second conductivity type, and near the pn junction the first epitaxial layer 2 with a high resistivity is provided. With this feature, when a relatively large surge current is applied resistance loss occurs in the first epitaxial layer 2 with a high resistivity to raise the temperature. The heat is transferred to the pn junction 7 and when the temperature thereof reaches about 300° C., the secondary breakdown occurs to lower the breakdown voltage from point A to point $A_1$ as shown in FIG. 3. This increases the maximum current to flow upto a breakdown and makes it possible to withstand a large surge current.

In the present embodiment the exothermic body is provided by forming the first epitaxial layer 2 with high resistivity between the substrate 1 and the second epitaxial layer 3 where the pn junction is formed. However, as far as the exothermic body is provided in the neighbourhood of the pn junction so as to immediately rise temperature of the pn junction, and so as to cause secondary breakdown of diode before breaking by exceeding allowable loss, the exothermic body may be in any form, and may be located in any place. That is to say, the exothermic body may be in the form of a resistance connected in series on the surface of the substrate, may be an electrode part of which contact resistance between the semiconductor layer and the electrode is high or may be a semiconductor substrate having high resistivity.

An example of a process for manufacturing the diode suited for absorbing a surge according to the present invention will be explained.

Figure 2A:
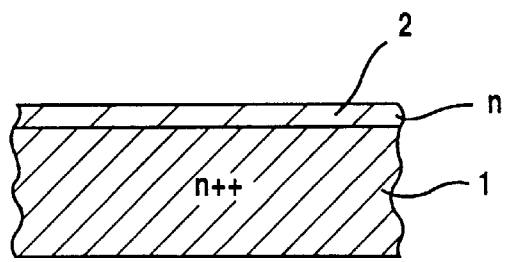
FIGS. 2a through 2c are an explanatory section for illustrating a manufacturing procedure for a diode suited for absorbing a surge according to the present invention.

As shown in FIG. 2(a), as the semiconductor substrate 1 is employed an $n^{++}$-type substrate with a low resistivity of $\frac{1}{1000}$ to $\frac{20}{1000}$ $\Omega \cdot cm$ which contains a group V impurities such as antimony, arsenic or phosphorus in very high concentration, for example, about $10^{18}/cm^3$ to $10^{19}/cm^3$. On the surface of the substrate 1 a semiconductor crystal layer with a high resistivity is grown epitaxially as the first epitaxial layer 2. In an exemplary case, the semiconductor substrate 1 is placed in, for example, a quartz bell jar (now shown), into which is then introduced a mixture of gases of 15 g/min of trichlorosilane ($SiHCl_3$) for growth, 5 sccm of phosphine ($PH_3$) as dopant, and 140 slm of hydrogen as a carrier gas. The mixed gas is reacted at about 1130° to 1150° C. for about seven minutes to epitaxially grow on the surface of the substrate 1 an n-type silicon crystal layer with a high resistivity of 10 $\Omega \cdot cm$ to a thickness of 10 $\mu$m.

Figure 2B:
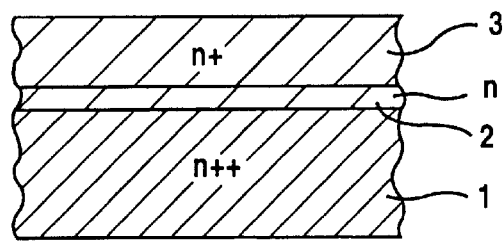

Next, as shown in FIG. 2(b), the second epitaxial layer 3 of $n^+$-type is formed on the first epitaxial layer 2. In the second epitaxial layer 3 the pn junction for the Zener diode will be formed. In the exemplary case, the $n^+$-type second epitaxial layer 3 of a thickness about 20 $\mu$m with a resistivity of about 0.1 $\Omega \cdot cm$ is epitaxially grown for the Zener breakdown voltage 39 V.

Figure 2C:
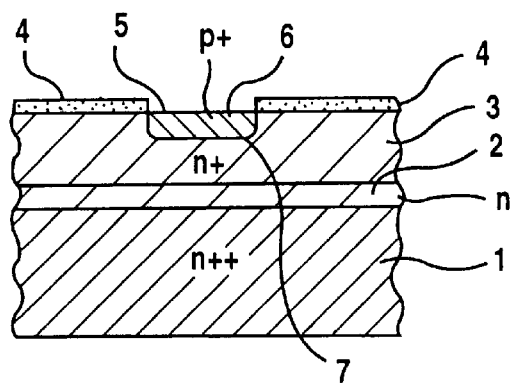

Next, as shown in FIG. 2(c), the insulating film 4 made of silicon oxide is formed on the surface of the semiconductor substrate 1 by an oxidation process or a like process, and the opening 5 is formed in the insulating film 4 by photoetching. Thereafter, the second epitaxial layer 3 under the opening 5 is selectively doped with impurities of group III element such as boron through the opening 5 to form the semiconductor region 6 of the second conductivity ($p^+$-type). Thus, the pn junction 7 with Zener characteristics is formed in the interface between the second epitaxial layer 3 and the semiconductor region 6.

Finally, the electrodes 8 and 9 of either a single aluminum layer or a multilayer such as made of aluminum, titanium and silver are formed on the exposed portion in the opening 5 and on the entire lower surface of the substrate 1, respectively. The resulting structure is then diced into individual semiconductor chips to yield a diode 10 as shown in FIG. 1.

Figure 4:
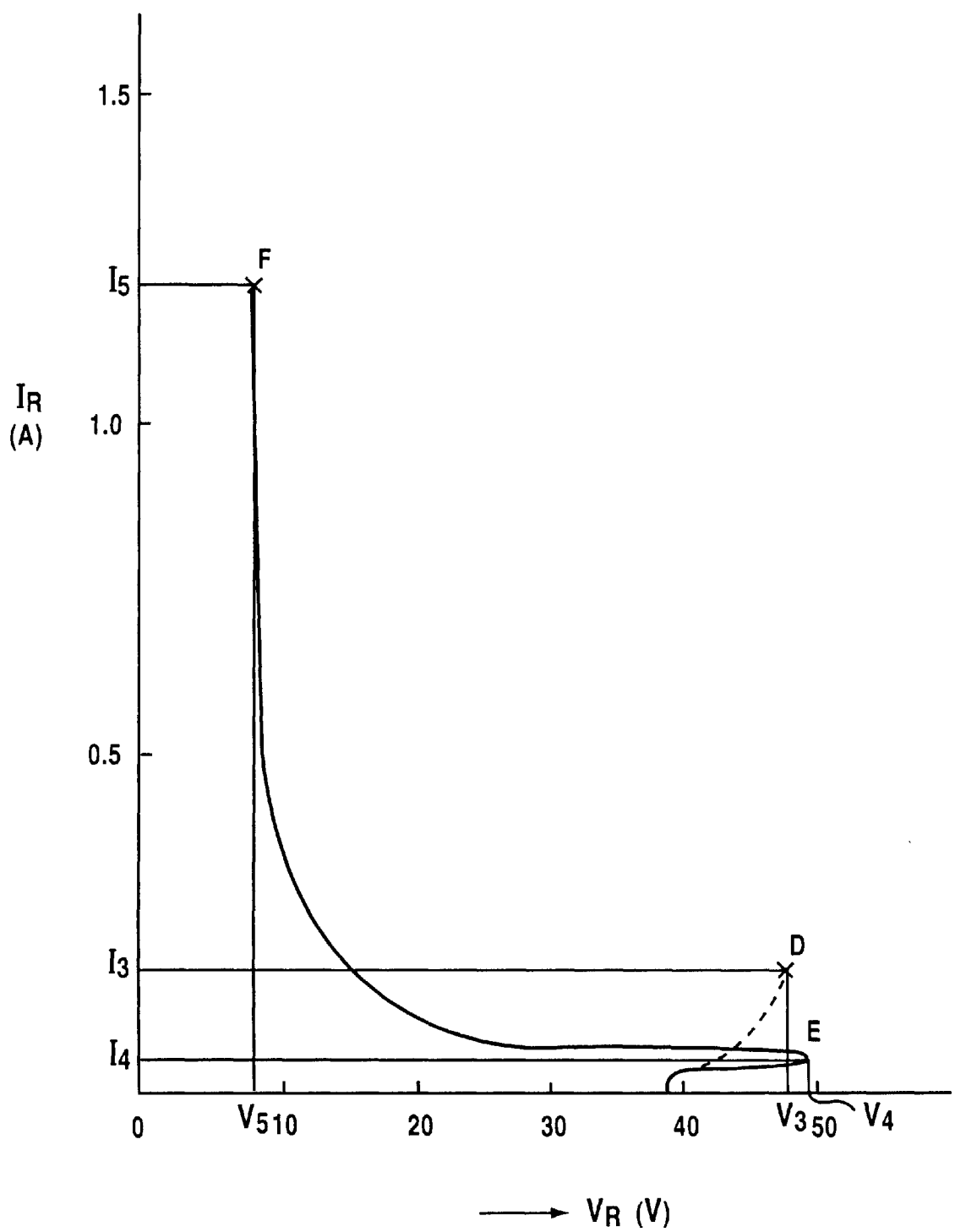
FIG. 4 is a diagrammatic representation of a characteristic to withstand a surge of a diode according to the present invention.
Figure 5:
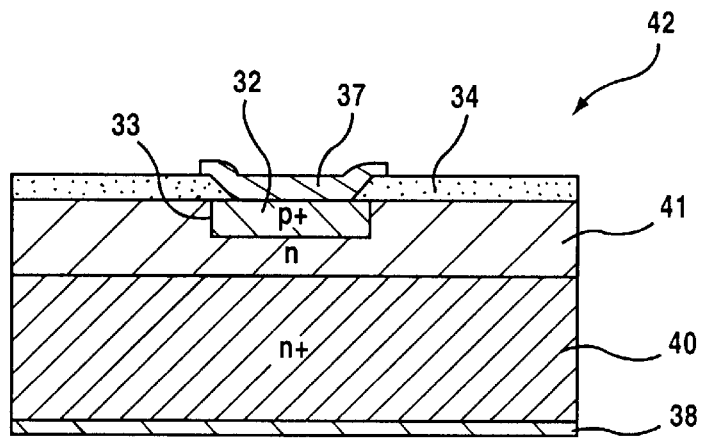
FIG. 5 is an explanatory section showing one example of the prior art Zener diode.
Figure 6:
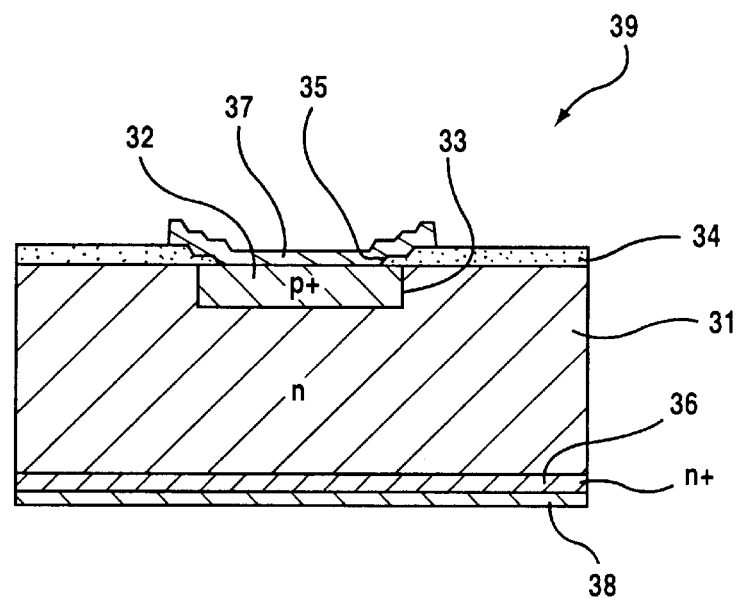
FIG. 6 is an explanatory section showing another example of the prior art Zener diode.
Figure 7:
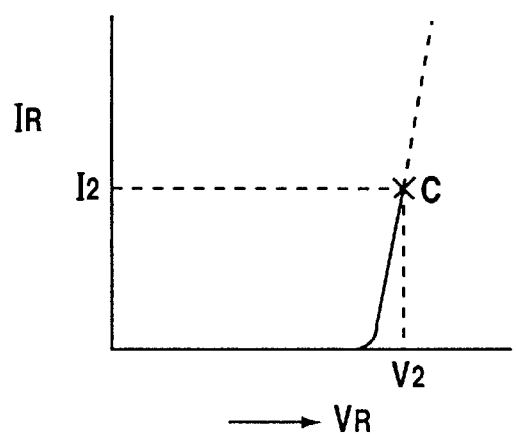
FIG. 7 is a diagrammatic representation of current-voltage characteristics of the prior art Zener diode.

FIG. 4 shows the characteristic curve against a surge of diode of the present embodiment in comparison with that of a prior art and wherein a solid line represents the characteristic curve of the present embodiment, and a broken line represents that of the prior art. When reverse voltage $V_R$ is applied to the diode of the present embodiment and that of the prior art respectively, the Zener breakdown occurs at about 39 V and a current begins to flow in either diode. Thereafter, when the reverse voltage is raised, the prior art diode is broken down at a breakdown withstand power (allowable loss point D) of $I_3 \times V_3$ ($I_3$=0.18 A, $V_3$=48 V), namely at an input electric power of 8.64 W. On the other hand, the diode of the present embodiment allows an input to reach an input point E of $I_4 \times V_4$ ($I_4$=0.05 A, $V_4$=49.5 V) once. The electric power at this moment raises the temperature of the pn junction to cause the secondary breakdown, so that the current increases with the decreasing voltage. Finally, the diode is broken down at an allowable loss point F.

In the diode of the present embodiment the electric power, $I_5 \times V_5$ ($I_5$=1.2A, $V_5$=7.5V), at the allowable loss point F is 9 W, which value is substantially equal to the breakdown withstand power of the prior art diode. However, the allowable current of the diode of the present invention is improved to six to seven times as large as that of the prior art diode. Therefore, the diode of the present embodiment can withstand a high surge current.

Since the thus constructed diode 10 for absorbing a surge employs the semiconductor substrate 1 with very high impurity concentration, additional diffusion of impurities is not necessary to provide an ohmic contact with the lower electrode 9, resulting in a reduced number of manufacturing steps. Further, the Zener characteristics of the diode 10 depend on the respective impurity concentration of the second epitaxial layer 3 and the semiconductor region 6 of the second conductivity type. The epitaxial growth of the second epitaxial layer 3 makes it possible to remarkably reduce the inconstancy of characteristics in the plane of the silicon wafer used, and to improve a yield greatly.

It should be understood that although the pn junction is formed by forming the $p^+$-type layer in the $n^+$-type layer according to the present embodiment, the same effects would be obtained if the conductivity type of each layer is reversed.

According to the present invention, as has been described, the secondary breakdown of the pn junction is positively utilized. Hence, the diode of the present invention can withstand a heavy surge current within the range of withstand voltage with the result that the characteristic against surge currents is greatly improved.

Further, the diode of the present invention employs a semiconductor substrate with a high impurity concentration. This eliminates an impurity diffusion step for providing an ohmic contact with a lower electrode, so that the number of manufacturing steps can be reduced. As a result the costs for manufacturing the diode can be reduced.

Though several embodiments of the present invention are described above, it is to be understood that the present invention is not limited only to the above-mentioned, and various changes and modifications may be applied to the invention without departing from the spirit and scope thereof.

What is claimed is:

1. A diode comprising:

a semiconductor substrate;

a pn junction provided in the semiconductor substrate; and an exothermic body for heating the pn junction under an overcurrent, said exothermic body being provided in a neighborhood of the pn junction wherein the exothermic body is a semiconductor layer formed below the pn junction.

2. The diode of claim 1, wherein the exothermic body is a semiconductor layer having a high resistance.

3. A diode comprising:

a semiconductor substrate of a first conductivity type with a low resistivity;

a first epitaxial layer of the first conductivity type with a high resistivity being formed on the semiconductor substrate;

a second epitaxial layer of the first conductivity type being formed on the first epitaxial layer;

a semiconductor region of a second conductivity type which is formed in the second epitaxial layer; and a pn junction defined between the semiconductor region and the second epitaxial layer.

4. The diode of claim 3, wherein the resistivity of the substrate is 1 to 20 mΩ·cm, and the resistivity of the first epitaxial layer is 5 to 20 Ω·cm.

5. The diode of claim 4, wherein a thickness of the epitaxial layer is in the range of 10 to 20 μm.

6. A diode comprising:

a semiconductor substrate;

a semiconductor layer of a first conductivity type being formed on the substrate;

a semiconductor region of a second conductivity type being formed in the semiconductor layer;

a pn junction defined between the semiconductor region and the semiconductor layer; and an exothermic body provided below the pn junction and between the semiconductor layer and the substrate.

* * * * *